(12) United States Patent
Horiuchi

(10) Patent No.: US 7,791,927 B1
(45) Date of Patent: Sep. 7, 2010

(54) MIS-TRANSISTOR-BASED NONVOLATILE MEMORY CIRCUIT WITH STABLE AND ENHANCED PERFORMANCE

(75) Inventor: Tadahiko Horiuchi, Isehara (JP)

(73) Assignee: NSCore Inc., Fukuoka (JP)

( * ) Notice: Subject to any disclaimer, the term of this patent is extended or adjusted under 35 U.S.C. 154(b) by 87 days.

(21) Appl. No.: 12/372,780

(22) Filed: Feb. 18, 2009

(51) Int. Cl.
*G11C 11/00* (2006.01)
*G11C 11/34* (2006.01)

(52) U.S. Cl. .................. 365/154; 365/156; 365/182
(58) Field of Classification Search .................. 365/154
See application file for complete search history.

(56) References Cited

U.S. PATENT DOCUMENTS

| | | | |
|---|---|---|---|
| 3,636,530 A | 1/1972 | Hoff et al. | |
| 4,419,744 A | 12/1983 | Rutter | |
| 5,065,362 A * | 11/1991 | Herdt et al. | 365/154 |
| 5,956,269 A | 9/1999 | Ouyang et al. | |
| 6,038,168 A | 3/2000 | Allen et al. | |
| 6,064,590 A | 5/2000 | Han et al. | |
| 6,740,927 B1 | 5/2004 | Jeng | |
| 6,906,953 B2 | 6/2005 | Forbes | |
| 6,906,962 B2 | 6/2005 | Layman et al. | |
| 6,909,635 B2 | 6/2005 | Forbes et al. | |
| 7,149,104 B1 * | 12/2006 | Horiuchi | 365/154 |
| 7,227,234 B2 | 6/2007 | Roizin et al. | |
| 7,460,400 B1 * | 12/2008 | Kikuchi | 365/185.05 |
| 7,483,290 B2 * | 1/2009 | Kikuchi et al. | 365/154 |
| 7,518,917 B2 * | 4/2009 | Noda et al. | 365/185.08 |
| 7,733,714 B2 * | 6/2010 | Horiuchi et al. | 365/189.12 |
| 2004/0232477 A1 | 11/2004 | Iwata et al. | |
| 2004/0252554 A1 | 12/2004 | Fournel et al. | |

FOREIGN PATENT DOCUMENTS

| | | |
|---|---|---|
| JP | 06-076582 | 3/1994 |
| JP | 06-231587 | 8/1994 |
| JP | 2001-156188 | 6/2001 |
| JP | 2002-237540 | 8/2002 |
| WO | WO 2004/057621 | 7/2004 |
| WO | WO 2006/093629 | 9/2006 |

\* cited by examiner

*Primary Examiner*—Son L Mai
(74) *Attorney, Agent, or Firm*—IPUSA, PLLC

(57) ABSTRACT

A memory circuit includes a latch having a first node and a second node, a MIS transistor having a gate node, a first source/drain node coupled to the first node of the latch, and a second source/drain node, and a control circuit configured to control the gate node and second source/drain node to make a lingering change in a threshold voltage of the MIS transistor in a first operation and to cause the latch in a second operation to store data responsive to whether a lingering change in the threshold voltage is present, wherein the MIS transistor includes diffusion regions, a gate electrode, and sidewalls, wherein a metallurgical junction of each of the diffusion regions is positioned under the gate electrode, and a lateral boundary of a depletion layer in the diffusion region serving as a drain is positioned under a corresponding one of the sidewalls in the first operation.

8 Claims, 9 Drawing Sheets

MIS-TRANSISTOR-BASED NONVOLATILE MEMORY CIRCUIT WITH STABLE AND ENHANCED PERFORMANCE

BACKGROUND OF THE INVENTION

1. Field of the Invention

The disclosures herein generally relate to a memory circuit, and particularly relate to a nonvolatile memory circuit which is capable of retaining stored data in the absence of a power supply voltage.

2. Description of the Related Art

Conventionally, a nonvolatile memory cell requires a special structure such as a floating gate or a special material such as a ferroelectric material or ferromagnetic material for the purpose of achieving nonvolatile data retention. There is a new type of nonvolatile semiconductor memory device called PermSRAM, which uses a MIS (metal-insulating film-semiconductor) transistor as a nonvolatile memory cell (i.e., the basic unit of data storage). The MIS transistor used as a nonvolatile memory cell in PermSRAM has the same structure as ordinary MIS transistors used for conventional transistor functions (e.g., switching function), and do not require a special structure or a special material as described above. The absence of such a special structure and special material offers an advantage in cost reduction. PermSRAM was initially disclosed in PCT/JP2003/016143, which was filed on Dec. 17, 2003, the entire contents of which are hereby incorporated by reference.

PermSRAM is configured such that the MIS transistor used as a nonvolatile memory cell experiences an irreversible hot-carrier effect on purpose for storage of one-bit data. Here, the irreversible hot-carrier effect refers to the injection of carriers into the insulating film (i.e., oxide film) and/or sidewalls, which causes a change in the transistor's threshold voltage. Whether the threshold voltage has been changed due to a hot-carrier effect represents one-bit data "0" or "1". Such a change in the threshold voltage may be detected by sensing a difference in ON current between the nonvolatile-memory-cell MIS transistor and a reference MIS transistor by using a sensing circuit such as a latch circuit.

In PermSRAM, data supplied from an external source may be initially written to the latch circuit. A store operation is then performed to transfer the data from the latch circuit to the nonvolatile-memory-cell MIS transistor. Whether the nonvolatile-memory-cell MIS transistor experiences a hot-carrier effect in the store operation depends on whether the data stored in the latch circuit is 0 or 1. A recall operation is subsequently performed to read the data stored in the nonvolatile-memory-cell MIS transistor. If the nonvolatile-memory-cell MIS transistor has experienced a hot-carrier effect in the store operation, an ON current smaller than the ON current of the reference MIS transistor may be detected in the recall operation. If the nonvolatile-memory-cell MIS transistor has not experienced a hot-carrier effect in the store operation, an ON current larger than the reference ON current may be detected in the recall operation. The latch circuit may be used as a sense circuit to sense such difference in ON current, and latches data that is either "0" or "1" depending on whether the ON current of the nonvolatile-memory-cell MIS transistor is larger or smaller than the reference ON current.

Carriers trapped in the insulating film and/or sidewalls of a MIS transistor due to a hot carrier effect include both electrons and holes. In general, an electron having enough kinetic energy in a semiconductor material can knock a bound electron out of its bound state to create an electron-hole pair. This phenomenon is known as impact ionization. In a case of an NMOS transistor, hot electrons having high-kinetic energy flowing through a transistor channel from the source to the drain cause impact ionization to occur at the channel/drain junction to create electron-hole pairs. Such impact ionization also occurs in a PMOS transistor. That is, holes having high-kinetic energy causes impact ionization at the channel/drain junction of a PMOS transistor to create electron-hole pairs.

Carriers trapped in the sidewalls are generally more sustainable than carriers trapped in the insulating film. That is, carriers trapped in the sidewalls tend to stay trapped longer than carriers trapped in the insulating film. For the purpose of thus retaining nonvolatile data, it is preferable to have a large number of carriers trapped in the sidewalls rather than to have a large number of carriers trapped in the insulating film.

There is thus a need for PermSRAM that is configured to induce the trapping of carriers in the sidewalls.

SUMMARY OF THE INVENTION

It is a general object of the present invention to provide a memory circuit that substantially eliminates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a memory circuit particularly pointed out in the specification in such full, clear, concise, and exact terms as to enable a person having ordinary skill in the art to practice the invention.

According to one aspect, a memory circuit includes a latch having a first node and a second node to store data such that a logic level of the first node is an inverse of a logic level of the second node; a MIS transistor having a gate node, a first source/drain node, and a second source/drain node, the first source/drain node coupled to the first node of the latch; and a control circuit configured to control the gate node and second source/drain node of the MIS transistor to make a lingering change in a threshold voltage of the MIS transistor in a first operation and to cause the latch in a second operation to store data responsive to whether a lingering change in the threshold voltage is present, wherein the MIS transistor includes diffusion regions formed in a substrate; a gate electrode; and sidewalls, wherein a metallurgical junction of each of the diffusion regions is positioned under the gate electrode, and a lateral boundary of a depletion layer in one of the diffusion regions serving as a drain is positioned under a corresponding one of the sidewalls in the first operation.

According to at least one embodiment of the present invention, a metallurgical junction of each of the diffusion regions is positioned under the gate electrode. Such a configuration ensures that the threshold voltage of the transistor is rather stable against manufacturing variation. Further, a lateral boundary of a depletion layer in one of the diffusion regions serving as a drain is positioned under a corresponding one of the sidewalls in the first operation. With this configuration, hot carriers generated by impact ionization at the drain/channel boundary are easily injected into the sidewall, thereby achieving a large, sustainable change in the transistor characteristics.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

The disclosures herein are directed to PermSRAM. Namely, the memory cell transistors are MIS (metal-insulating film-semiconductor) transistors that have the same structure as ordinary MIS transistors used for conventional transistor functions (e.g., switching function). These memory cell transistors use neither a special structure, such as a floating gate, nor a special material, such as a ferroelectric material or a ferromagnetic material. These MIS transistors are configured to selectively experience a hot-carrier effect on purpose for storage of data. The hot-carrier effect leaves an irreversible lingering change in the transistor characteristics to the MIS transistors. A change in the transistor characteristics caused by the hot-carrier effect achieves nonvolatile data retention.

In the following description, NMOS transistors are used as an example of the nonvolatile-memory-cell MIS transistors, but such examples are not intended to be limiting. PMOS transistors may alternatively be used as nonvolatile-memory-cell transistors.

Figure 1:
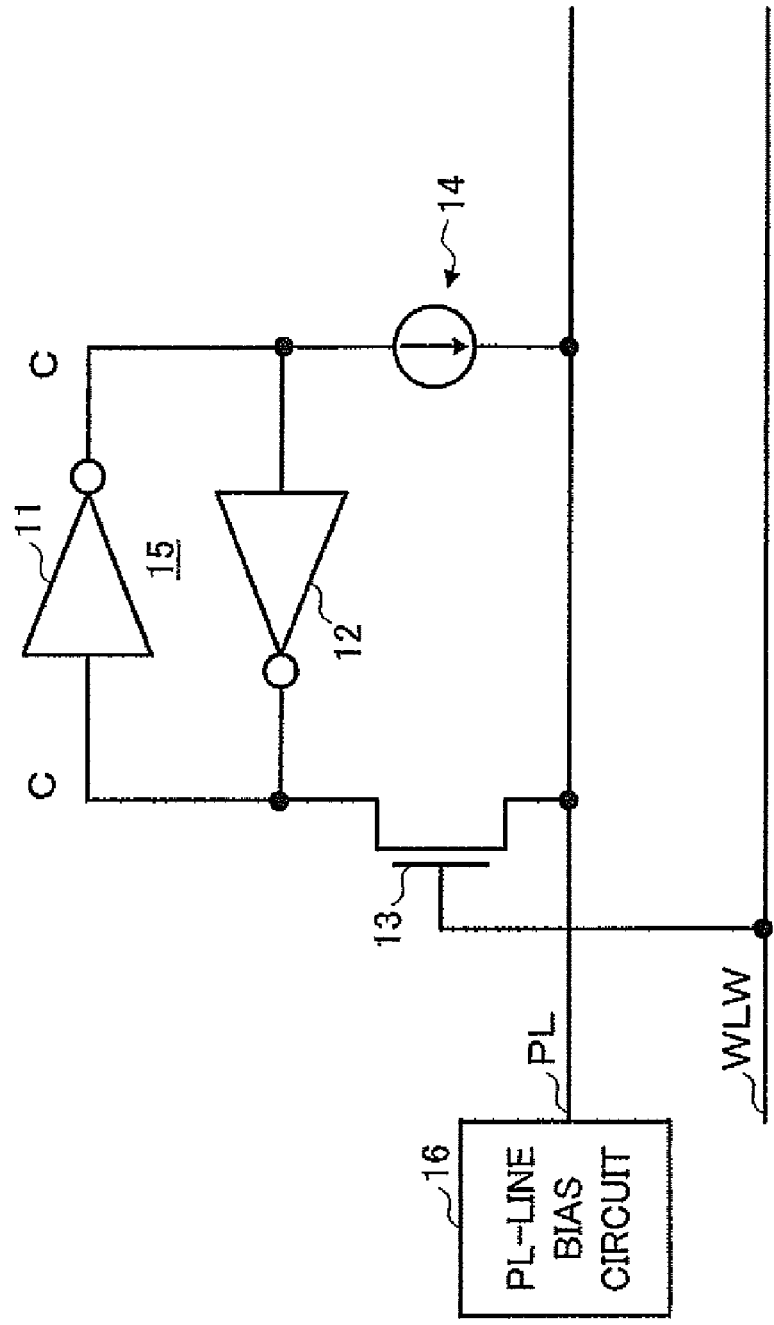
FIG. 1 is a circuit diagram showing an example of the configuration of a PermSRAM memory circuit.

FIG. 1 is a circuit diagram showing an example of the configuration of a PermSRAM memory circuit. A memory circuit shown in FIG. 1 includes an inverter 11, an inverter 12, an NMOS transistor 13, and a constant current source 14. The NMOS transistor 13 is a nonvolatile-memory-cell MIS transistor. As will be described later, the NMOS transistor 13 is configured such that the metallurgical junction of each drain/source region with the channel is situated under (immediately below) the gate electrode. The NMOS transistor 13 is further configured such that the end of the depletion layer inside the drain region is situated under (immediately below) the sidewall when the drain node is set to a predetermined potential for causing a hot-carrier effect.

As shown in FIG. 1, the gate node of the NMOS transistor 13 is coupled to a word selecting line WLW. One of the source/drain nodes of the NMOS transistor 13 is coupled to a plate line PL, and the other is coupled to an electrical node C. A PL-line bias circuit 16 applies a bias voltage to the plate line PL. One end of the constant current source 14 is coupled to the plate line PL to supply an electric current to the plate line PL. The other end of the constant current source 14 is coupled to an electrical node /C (the symbol "/" preceding another symbol indicates an inverse of the latter symbol) to draw an electric current from the electrical node /C.

A latch (flip-flop circuit) 15 is formed by the inverters 11 and 12, each of which has the output thereof coupled to the input of one another. When the latch 15 is activated, the electrical node C and electrical node /C are set to respective logic levels that are an inverse of each other.

In the memory circuit having the above-described configuration, the NMOS transistor 13 is designed to operate with a power supply voltage of 1.8 V, for example. Namely, when this transistor is driven with a voltage no greater than 1.8 V, a change in the characteristics due to a hot-carrier effect does not occur from a practical point of view.

When a store operation (write operation) is to be performed, the electrical nodes C and /C of the latch 15 are set to respective potentials. For example, the electrical node C may be set to 0 V, and the electrical node /C may be set to 1.8 V. Such settings reflect the value of data stored in the latch 15, which may be supplied from an external source. During this operation, the constant current source 14 is kept inactive. After the electrical nodes C and /C are set to the respective potentials as described above, the potential of the plate line PL is set to 5.0 V, for example. Further, the potential of the word selecting line WLW is set to 1.8 V, for example. The potential of the word selecting line WLW may be determined such as to maximize the effect of a hot-carrier phenomenon. At this point in time, the constant current source 14 still remains inactive, without allowing any passage of current.

With the potential settings as described above, a voltage of 5.0 V between the plate line PL and the electrical node C is applied between the drain node and source node of the NMOS transistor 13. Because this bias voltage is larger than the voltage used in routine operations, the NMOS transistor 13 experiences a strong hot-carrier effect. Specifically, the application of the bias voltages for a duration of 1 millisecond to 10 millisecond serves to generate a change in the characteristics that is substantially larger than the normal variation of the transistor characteristics. For example, the threshold voltage of the NMOS transistor 13 rises a few hundreds of millivolts. In other words, the channel resistance increases approximately 10 times.

If the potentials of the electrical nodes C and /C are reversed, with C being set to 1.8 V and /C being set to 0 V, the NMOS transistor 13 is placed in a nonconductive state, and, thus, does not experience a hot-carrier effect. In this case, there is no lingering change in the transistor characteristics of the NMOS transistor 13.

The hot-carrier effect as described above leaves an irreversible lingering change in the transistor characteristics. The presence or absence of change in the characteristics of the NMOS transistor 13 thus achieves a nonvolatile data retention that reflects the initial potential settings of the electrical nodes C and /C.

During the operation to store nonvolatile data as described above, the high potential (5.0 V) is never applied to the inverters 11 and 12. This is because the NMOS transistor 13 serves as an intervening circuit element between the plate line PL (5.0 V) and the node C. Because the word selecting line WLW is set to 1.8 V, and the node C serves as a source node, the potentials at the node C cannot exceed 1.8 V minus the threshold voltage. In this configuration, therefore, a hot-carrier effect does not happen in the transistors used in the latch 15. All the MIS transistors used in the memory cell (i.e., the MIS transistor 13 serving as a memory cell transistor and the MIS transistors constituting the latch 15) may thus be properly designed to have the same structure with the same thickness of the gate oxide film.

When a recall operation (read operation) for recalling (reading) data from the NMOS transistor 13 is to be performed, the latch 15 comprised of the inverters 11 and 12 is initially placed in an electrically inactive state, and is then shifted to an electrically active state. This may be achieved by shifting the power supply voltage VDD applied to the inverters 11 and 12 from 0 V to 1.8 V. The potentials of the word selecting line WLW and the plate line PL are set to 1.8 V and 0 V, respectively, before the latch 15 is activated. The constant current source 14 is active in this case thereby to provide a proper amount of reference current.

Consideration is first given to a case in which the NMOS transistor 13 has a lingering change in the characteristics due to a hot-carrier effect (such as an increase in the threshold voltage or a decrease in the ON current). In this case, the force that pulls down the electrical node C is weaker than the force that pulls down the electrical node /C based on the reference current. After the activation of the latch 15, therefore, the electrical node C is set to the HIGH level, and the electrical node /C is set to the LOW level.

In a next case, the NMOS transistor 13 does not have a lingering change in the characteristics due to a hot-carrier effect. In this case, the force that pulls down the electrical node C is stronger than the force that pulls down the electrical node /C based on the reference current. After the activation of the latch 15, therefore, the electrical node C is set to the LOW level, and the electrical node /C is set to the HIGH level.

In this manner, the configuration shown in FIG. 1 can detect and sense the data stored through a hot-carrier effect. It should be noted, however, that the HIGH/LOW levels of the electrical nodes C and /C are reversed between when the data is written and when the data is read. Because of this, there is a need for a data reversal circuit to invert data either at the time of data writing or at the time of data reading. Such a data reversal circuit may be implemented by use of an inverter.

The above description has been directed to a case in which the plate line PL is set to different potentials between the store operation and the recall operation. Alternatively, the plate line PL may be set to a fixed potential such as a ground potential during both the store operation and the recall operation. In such a case, the nodes C and /C need to be set to 5.0 V and 0 V (or 0 V and 15 V), respectively, to perform a store operation causing a hot-carrier effect. This arrangement is possible when the transistors constituting the inverters 11 and 12 have a thicker gate oxide film that ensures hot-carrier-effect-free transistor operations even at high potentials. When data is stored in this manner, data reversal as previously described does not occur, and, thus, there is no need to provide a data reversal circuit.

Figure 2:
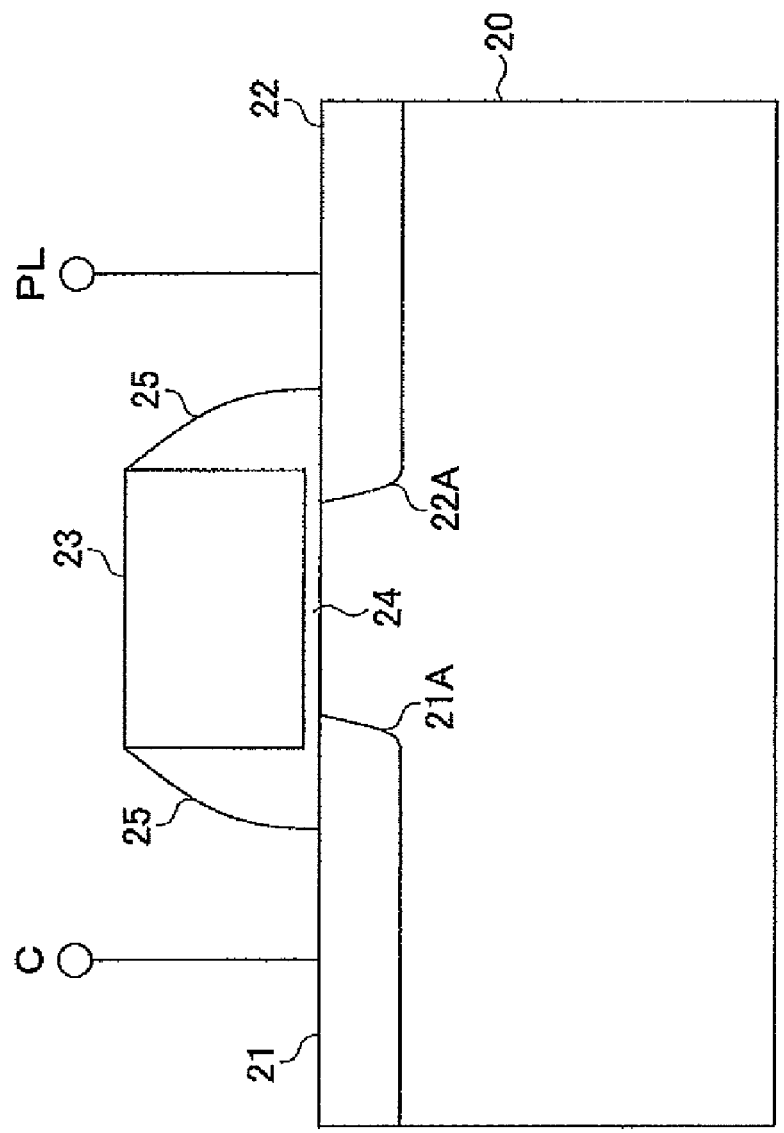
FIG. 2 is a cross-sectional view of an NMOS transistor shown in FIG. 1.

FIG. 2 is a cross-sectional view of the NMOS transistor 13 shown in FIG. 1. An N-type diffusion region 21 and an N-type diffusion region 22 are formed in a P-type substrate 20 to serve as the source C and drain PL of a transistor. A gate electrode 23 is formed on the P-type substrate 20 at the position of a channel between the source and the drain, with an insulating film 24 (e.g., oxide film) intervening between the gate electrode 23 and the P-type substrate 20. Sidewalls 25 are disposed on the lateral faces of the gate electrode 23.

The metallurgical junction 21A of the N-type diffusion region 21 with the channel is defined as the area of actual contact between a P-type semiconductor and an N-type semiconductor, and is characterized as the plane at which concentration of acceptors is the same as concentration of donors. By the same token, the metallurgical junction 22A of the N-type diffusion region 22 with the channel defined as the area of actual contact between a P-type semiconductor and an N-type semiconductor, and is characterized as the plane at which concentration of acceptors is the same as concentration of donors. As shown in FIG. 2, the metallurgical junction 21A and the metallurgical junction 22A are positioned under (immediately below) the gate electrode 23. Namely, there is an overlap between the gate electrode 23 and the N-type diffusion region 21 when viewed from above. There is also an overlap between the gate electrode 23 and the N-type diffusion region 22 when viewed from above. Such a configuration ensures that the threshold voltage of the transistor is rather stable against any manufacturing variations, as will be described layer in detail.

Figure 3:
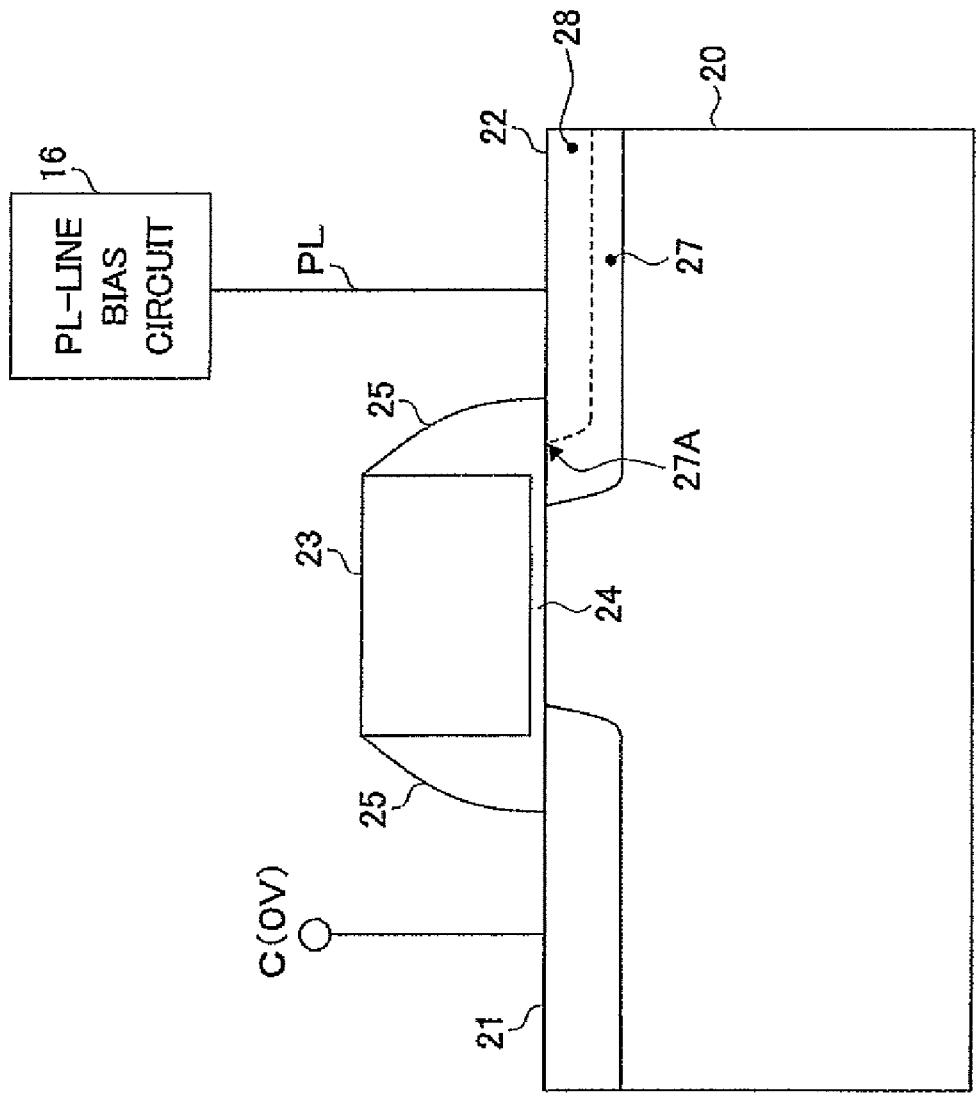
FIG. 3 is a cross-sectional view of the NMOS transistor shown in FIG. 1 when the gate node is set to a potential for causing a hot-carrier effect.

FIG. 3 is a cross-sectional view of the NMOS transistor 13 shown in FIG. 1 when the gate node is set to a potential for causing a hot-carrier effect. In FIG. 3, the source node C (i.e., the N-type diffusion region 21) is set to 0 V, and the drain node PL (i.e., the N-type diffusion region 22) is set to 5 V by the PL-line bias circuit 16. With these potential settings, the application of 1.8 V to the gate electrode 23 causes hot carriers (which are predominantly electrons) to be trapped mainly in the sidewall 25 over the N-type diffusion region 22 and also trapped in the oxide film 24.

The application of 5 V to the drain node PL (i.e., plate line PL in FIG. 1) as described above widens a depletion layer 27 so that the depletion layer 27 extends further into the N-type diffusion region 22. An end 27A of the depletion layer 27 inside the N-type diffusion region 22 is positioned under (immediately below) the sidewall 25 on the drain side. That is, the end point 27A up to which the depletion layer 27 extends into the N-type diffusion region 22 near the surface of the P-type substrate 20 is situated under the sidewall 25 on the drain side. In other words, the end 27A of a neutral region 28 where the carrier density is substantially equal to the doping density is positioned under the sidewall 25 on the drain side. The position of the point 27A corresponds to the position of the interface between the depletion layer 27 and the neutral region 28, and also corresponds to the lateral boundary of the depletion layer 27.

In a case of an NMOS transistor, hot electrons having high-kinetic energy flowing through a transistor channel from the source to the drain cause impact ionization to occur at the channel/drain junction to create electron-hole pairs. In FIG. 3, such impact ionization mainly occurs at the interface between the depletion layer 27 and the neutral region 28. Because this interface is positioned immediately under the sidewall 25 on the drain side, hot carriers generated by the impact ionization are easily injected into the sidewall 25. This injection achieves a large, sustainable change in the transistor characteristics.

Figure 4:
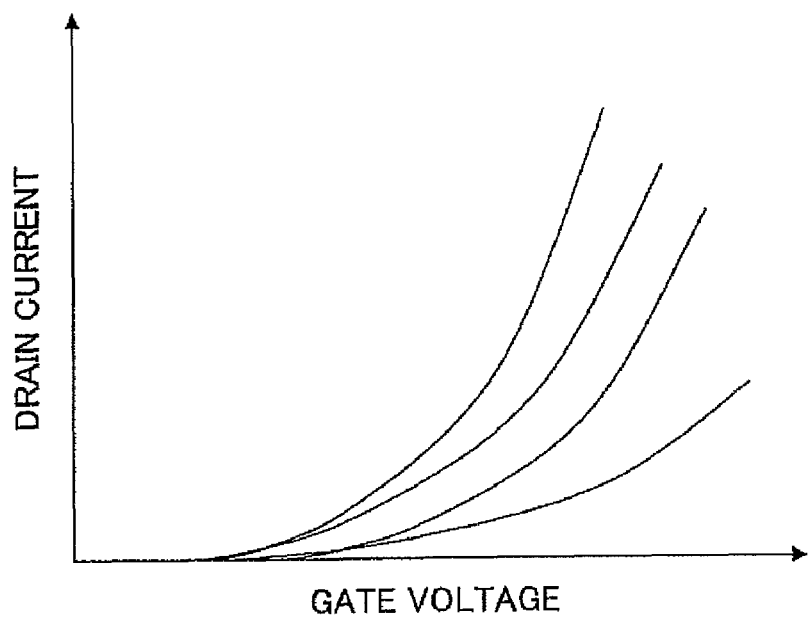
FIG. 4 is a drawing showing manufacturing variation in the characteristics of a transistor in which metallurgical junctions are not situated under the gate.

FIG. 4 is a drawing showing manufacturing variations in the characteristics of a transistor in which the metallurgical junctions are not situated under the gate. In FIG. 4, the horizontal axis represents the gate voltage (i.e., gate-source voltage), and the vertical axis represents the drain current. Each curve in FIG. 4 corresponds to a particular transistor with nominally identical specifications. When there is no overlapping between the gate electrode and the source region and between the gate electrode and the drain region, the threshold voltage and drain current greatly vary as shown in FIG. 4. The cause of this variation can be explained as follows. When a proper voltage is applied to the gate electrode, an inversion layer is formed as a conducting channel under (immediately below) the gate electrode. Where the gate electrode and the source region do not overlap, the source diffusion region is not in direct contact with this inversion layer channel. The gap between the source diffusion region and the channel acts as a large resistance, which varies depending on the size of the gap. When the size of the gap varies due to manufacturing variation, thus, the threshold voltage and the drain current greatly vary as shown in FIG. 4. The same also applies to the relationship between the inversion layer channel and the drain diffusion region.

Figure 5:
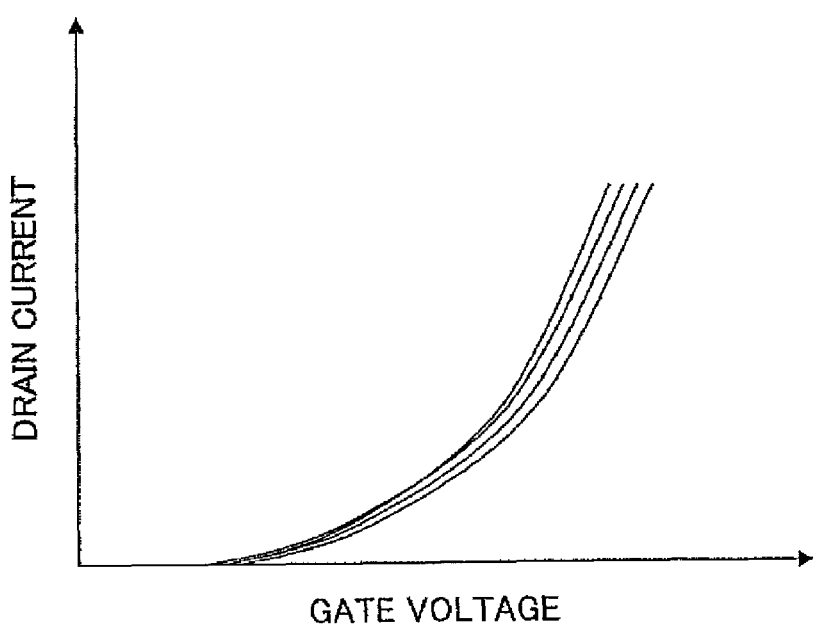
FIG. 5 is a drawing showing manufacturing variation in the characteristics of a transistor in which metallurgical junctions are situated under the gate.

FIG. 5 is a drawing showing manufacturing variation in the characteristics of a transistor in which the metallurgical junctions are situated under the gate. In FIG. 5, the horizontal axis represents the gate voltage (i.e., gate-source voltage), and the vertical axis represents the drain current. When there is overlapping between the gate electrode and the source region and between the gate electrode and the drain region, the threshold voltage and drain current exhibit relatively little variation as shown in FIG. 5. Each curve in FIG. 5 corresponds to a particular transistor with nominally identical specifications. The reason why there is little variation can be explained as follows. Where the gate electrode and the source region overlap each other, the source diffusion region is in direct contact with the inversion layer channel. There is thus no gap that acts as a large resistance between the source diffusion region and the channel. Even when the boundary of the source diffusion region shifts due to manufacturing variation, thus, the threshold voltage and the drain current have rather constant characteristics as shown in FIG. 5. The same also applies to the relationship between the inversion layer channel and the drain diffusion region.

Figure 6:
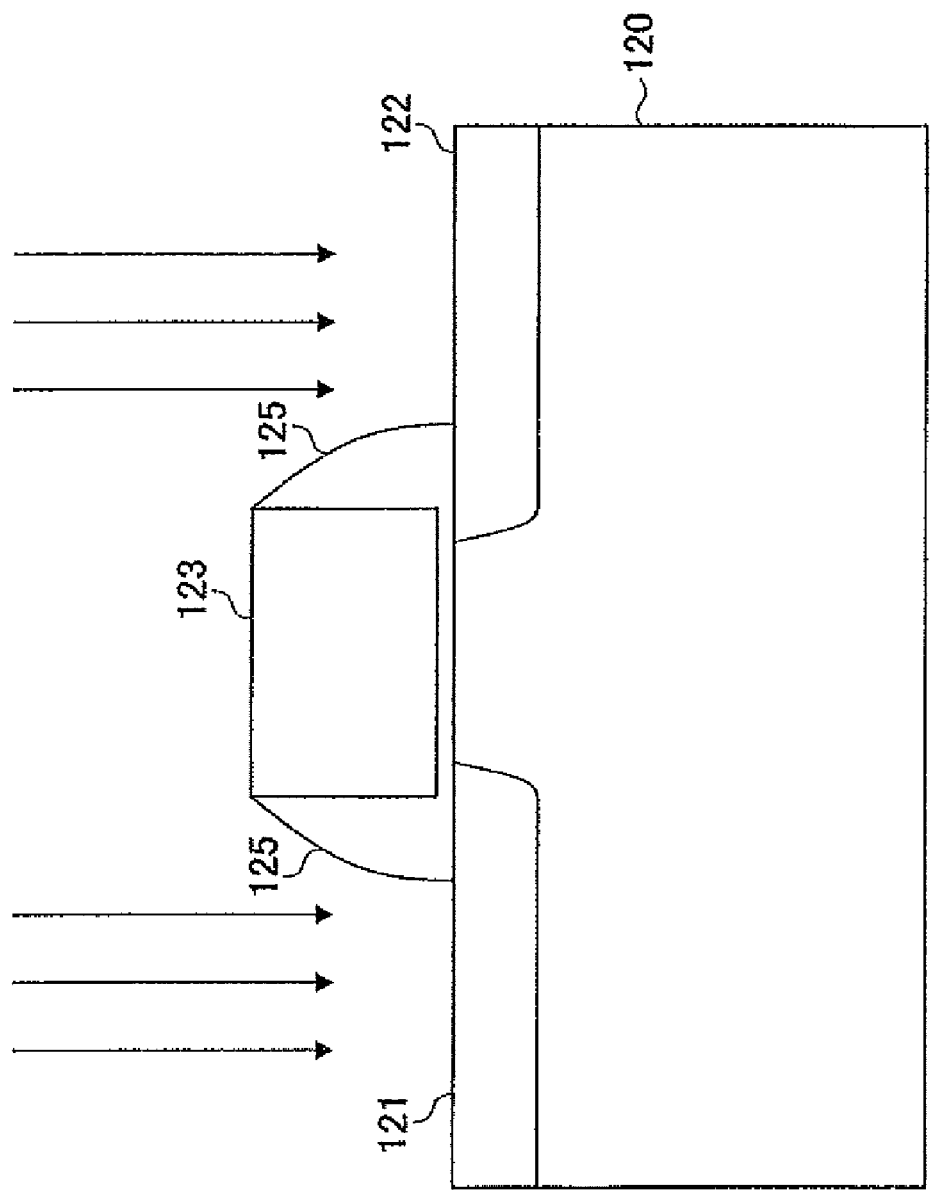
FIG. 6 is a drawing showing a process of performing ion implantation to create diffusion regions.

FIG. 6 is a drawing showing a process of performing ion implantation to create diffusion regions. In this example, ion implantation creates diffusion regions that do not overlap the gate electrode. A gate electrode 123 is first formed on a P-type substrate 120, and, then, sidewalls 125 are formed on the P-type substrate 120 at the lateral faces of the gate electrode 123. Ion implantation as illustrated by arrows is then performed to create an, N-type diffusion region 121 and an N-type diffusion region 122. In this ion implantation, both the gate electrode 123 and the sidewalls 125 are utilized as a mask, so that the N-type diffusion regions 121 and 122 are created outside the sidewalls 125. Subsequent heat treatment causes thermal diffusion of the implanted ions, which results in the spreading of the N-type diffusion regions 121 and 122. As a result, the N-type diffusion regions 121 and 122 extend into areas under the sidewalls 125 as shown in FIG. 6. Because the ion implantation is performed after the forming of the sidewalls 125, the metallurgical junctions of the N-type diffusion regions 121 and 122 with the P-type substrate 120 near its surface are situated outside the area under the gate electrode 123.

Figure 7:
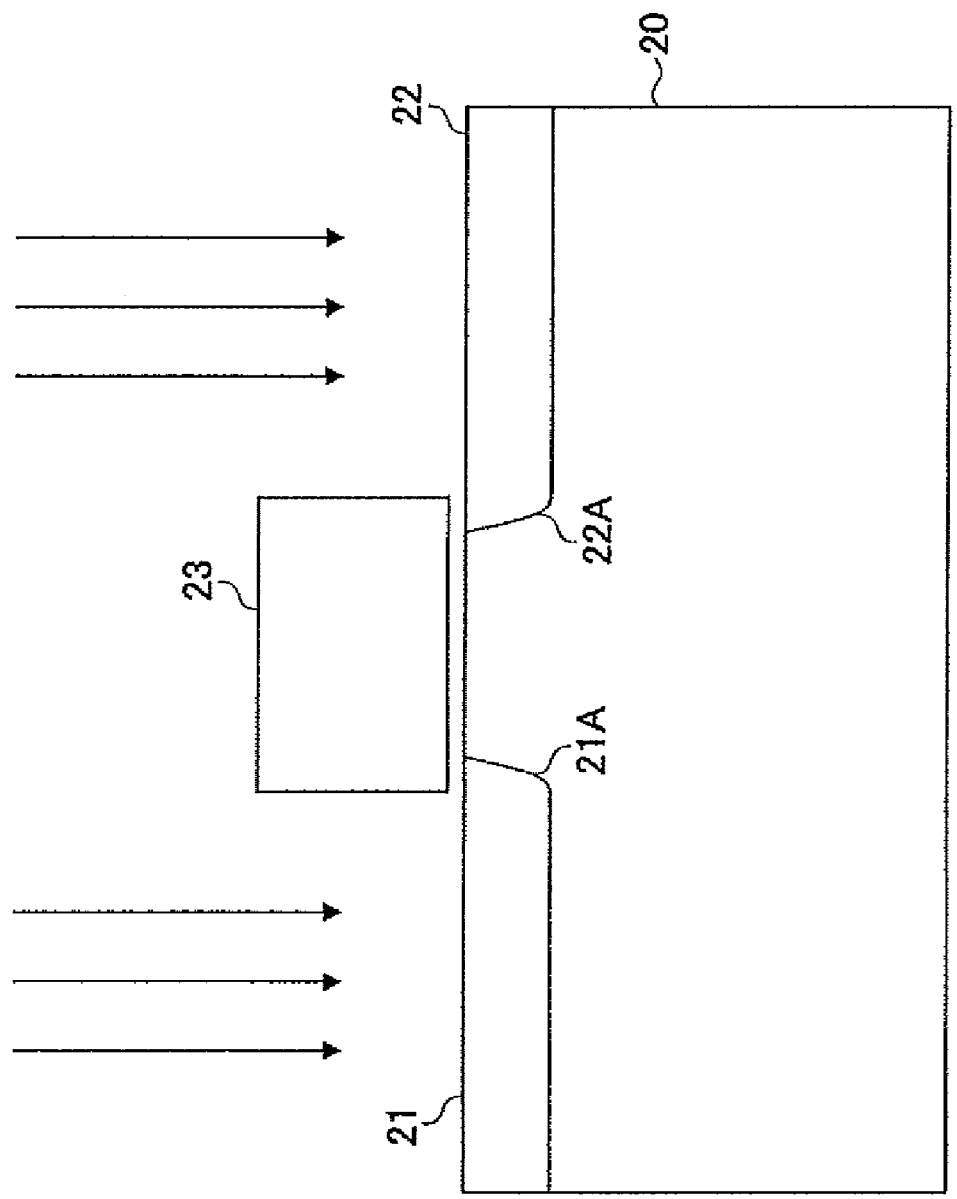
FIG. 7 is a drawing showing a process of performing ion implantation to create diffusion regions for the transistor shown in FIG. 2.

FIG. 7 is a drawing showing a process of performing ion implantation to create diffusion regions for the transistor shown in FIG. 2. In this example, ion implantation creates diffusion regions that overlap the gate electrode. The gate electrode 123 is first formed on the P-type substrate 20, and, then, ion implantation as illustrated by arrows is performed to create an N-type diffusion region 21 and an N-type diffusion region 22 before forming sidewalls. In this ion implantation, only the gate electrode 23 is utilized as a mask, so that the N-type diffusion regions 21 and 22 are created just outside the gate electrode 23. Subsequent heat treatment causes thermal diffusion of the implanted ions, which results in the spreading of the N-type diffusion regions 21 and 22. As a result, the N-type diffusion regions 21 and 22 extend into the area under the gate electrode 23 as shown in FIG. 7. Because ion implantation is performed before the forming of the sidewalls 25 shown in FIG. 2, the metallurgical junctions 21A and 22A of the N-type diffusion regions 21 and 22 with the P-type substrate 20 near its surface are situated under (immediately below) the gate electrode 23.

Figure 8:
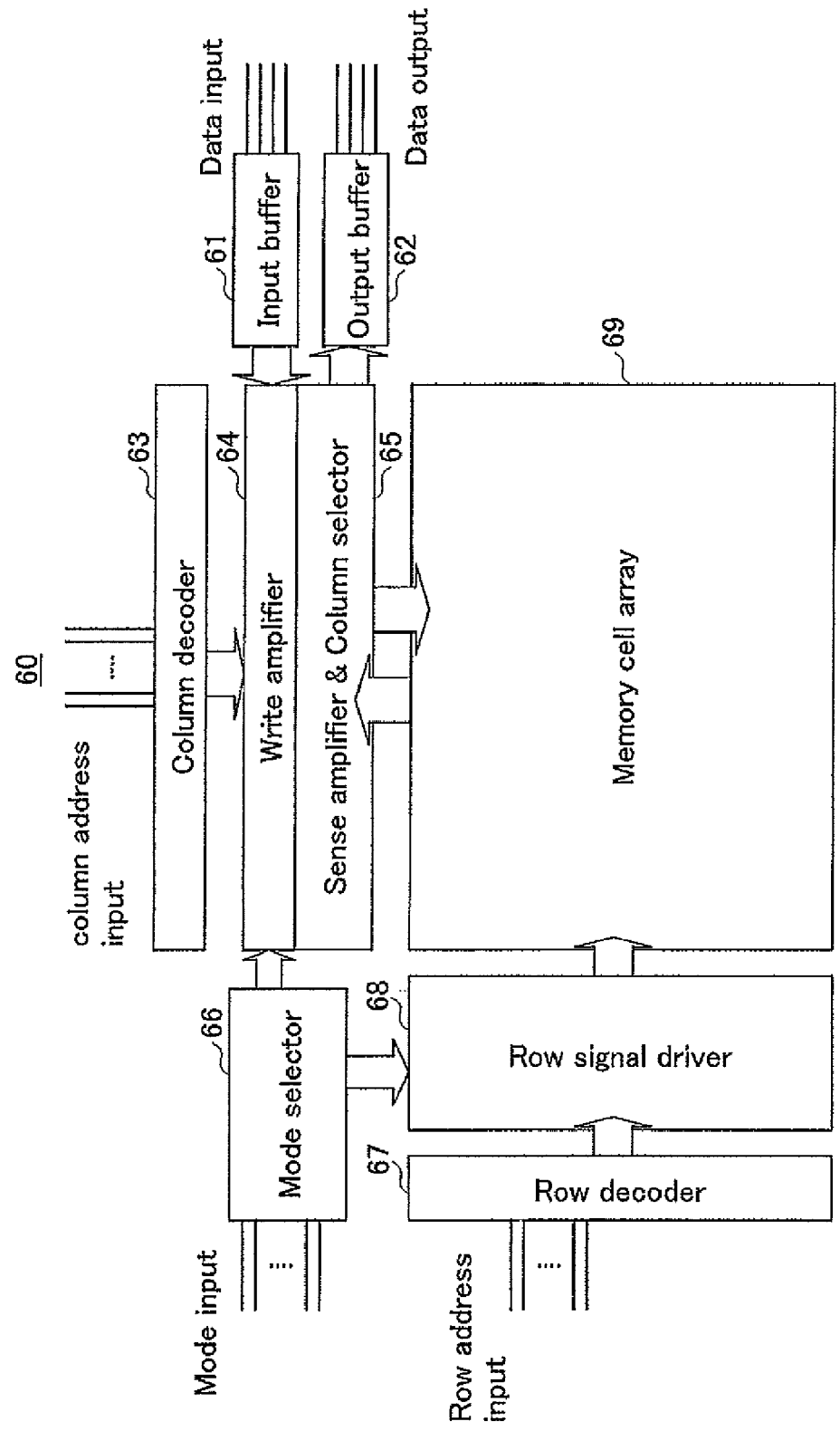
FIG. 8 is a block diagram showing the configuration of a nonvolatile semiconductor memory device.

FIG. 8 is a block diagram showing the configuration of a nonvolatile semiconductor memory device. A semiconductor memory device 60 shown in FIG. 8 includes an input buffer 61, an output buffer 62, a column decoder 63, a write amplifier 64, a sense amplifier & column selector 65, a mode selector 66, a row decoder 67, a row signal driver 68, and a memory cell array 69. The memory cell array 69 includes a plurality of memory cells arranged in matrix form, each memory cell corresponding to the NMOS transistor 13 shown in FIG. 1. The memory cells arranged in the same column are connected to the same bit line, and the memory cells arranged in the same row are connected to the same word selecting line WLW (see FIG. 1).

In the semiconductor memory device 60, the mode selector 66 receives mode input signals from an exterior of the device, and decodes the mode input signals to determine an operation mode (e.g., a write operation mode or a read operation mode). Control signals responsive to the determined operation mode are supplied to the write amplifier 64, the sense amplifier & column selector 65, the row signal driver 68, etc., for control of the individual parts of the semiconductor memory device 60. The column decoder 63, the write amplifier 64, the sense amplifier & column selector 65, the mode selector 66, the row decoder 67, and the row signal driver 68 serve as a control circuit to control a write/read operation with respect to the memory cell array 69.

The column decoder 63 receives a column address supplied from an external source situated outside the semiconductor memory device 60, and decodes the column address to determine a selected column. The decode signals indicative of the selected column are supplied to the write amplifier 64 and the sense amplifier & column selector 65. The row decoder 67 receives a row address supplied from the external source, and decodes the row address to determine a selected row. The decode signals indicative of the selected row are supplied to the row signal driver 68.

Upon receiving the control signals from the mode selector 66 and the decode signals from the row decoder 67, the row signal driver 68 activates a selected word selecting line and a selected plate line among the word selecting lines and plate lines extending from the row signal driver 68. In response to the control signals from the mode selector 66 and the decode signals from the column decoder 63, the sense amplifier & column selector 65 couples a bit line corresponding to the selected column to a data bus. Through this coupling, data is transferred between the memory cell array 69 and the data bus.

In the case of a read operation, the sense amplifier & column selector 65 amplifies data read from the memory cell array 69 for provision to the output buffer 62. The data is output from the output buffer 62 to outside the semiconductor memory device 60 as output data. In the case of a write operation, input data supplied to the input buffer 61 from an external source is provided to the write amplifier 64. The write amplifier 64 amplifies the input data to be written to the memory cell array 69.

Figure 9:
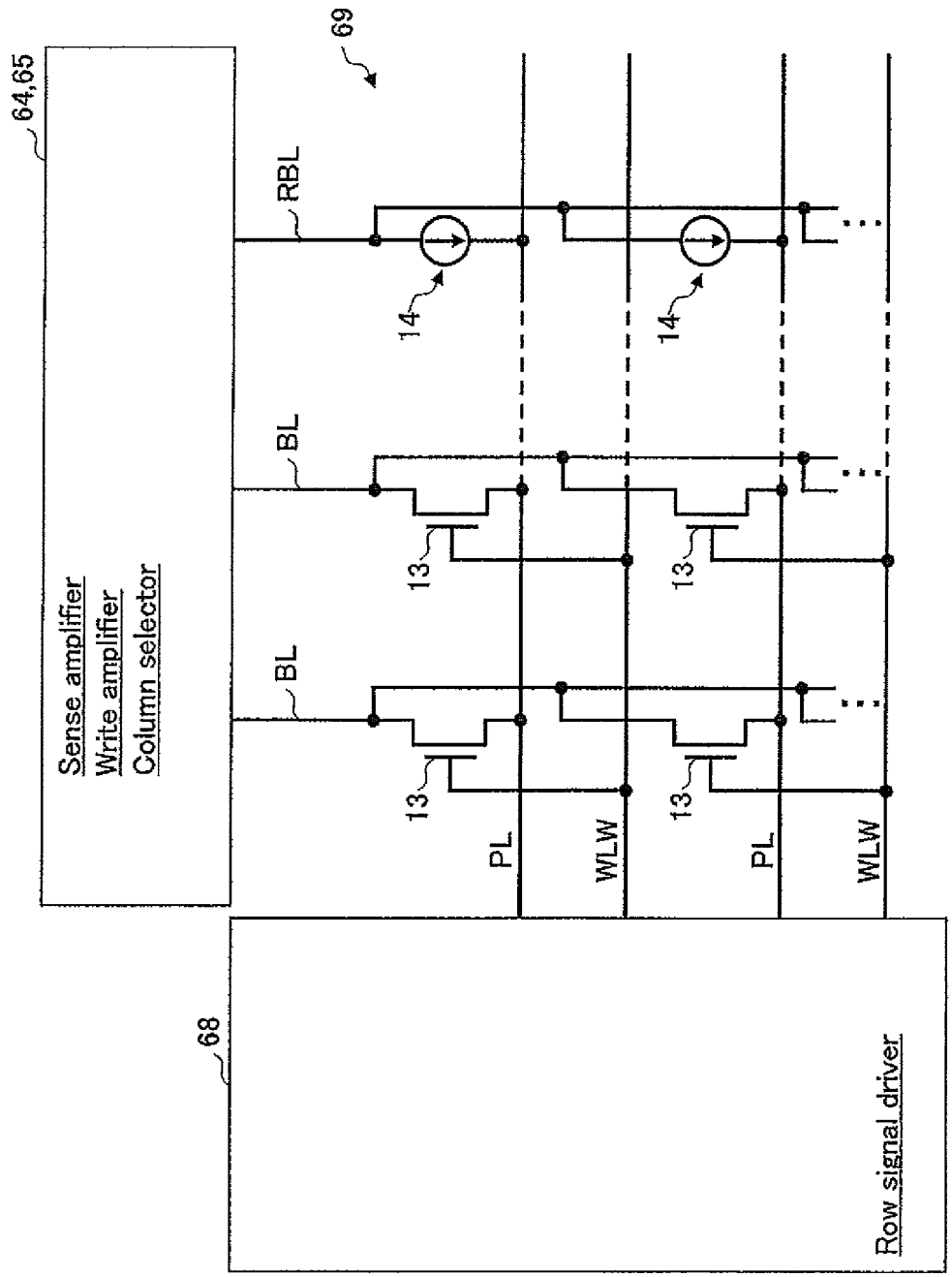
FIG. 9 is an illustrative drawing showing connections between memory cells and a write amplifier, a sense amplifier & column selector, and a row signal driver shown in FIG. 8.

FIG. 9 is an illustrative drawing showing connections between memory cells and the write amplifier 64, the sense amplifier & column selector 65, and the row signal driver 68. In FIG. 9, the same elements as those of FIG. 1 and FIG. 8 are referred to by the same numerals, and a description thereof will be omitted.

Bit lines BL extend from the write amplifier 64 and the sense amplifier & column selector 65, and are coupled to the memory cells (i.e., the NMOS transistors 13). Further, a reference bit line RL extends from the write amplifier 64 and the sense amplifier & column selector 65, and is coupled to constant current sources 14. The word selecting lines WLW extend from the row signal driver 68 to be coupled to the gates of the NMOS transistors 13. The plate lines PL also extend from the row signal driver 68 to be connected to the source/drain of the NMOS transistors 13.

As was described in connection with FIG. 1, the latch 15 is used for writing and reading data to and from the NMOS transistor 13. The configuration shown in FIG. 9 also utilizes such latches. That is, latches, each corresponding to the latch 15, are provided in the write amplifier 64 and/or the sense amplifier & column selector 65. Both a write operation and a read operation may utilize a common latch 15. Alternatively, a latch 15 provided in the write amplifier 64 may be used when writing data to a NMOS transistor 13, and another latch 15 provided in the sense amplifier & column selector 65 may be used when reading data. Switching between these latches and the bit lines BL may be performed by transfer gates operating under the control of the mode selector 66.

As previously described, a data reversal circuit for inverting data at the time of data writing or at the time of data reading may be necessary. Such a data reversal circuit may be situated either in the write amplifier 64 to reverse data at the time of data writing or in the sense amplifier & column selector 65 to reverse data at the time of data reading. Such data reversal may be implemented simply by switching signal paths.

When a data write operation is performed, a selected bit line BL corresponding to a selected column carries write data supplied from an external source. The row signal driver 68 sets a selected word selecting line WLW to 1.8 V, and sets the remaining word selecting lines WLW to 0 V. Further, the row signal driver 68 sets a selected plate line PL to 5.0 V, and sets the remaining plate lines PL to 0 V. This causes the NMOS transistor 13 on the selected row at the selected column to experience a hot-carrier effect or not to experience a hot-carrier effect, depending on the value of the corresponding data bit carried on the selected bit line BL.

When a data read operation is performed, the row signal driver 68 sets a selected word selecting line WLW to 1.8 V, and sets the remaining word selecting lines WLW to 0 V. All the plate lines PL are kept at 0 V in the data read operation. A selected bit line BL corresponding to a selected column is coupled to the latch 15 which may be provided in the sense amplifier & column selector 65. The reference bit line RBL is also coupled to this latch 15. The latch 15 senses the data stored in the NMOS transistor 13 on the selected row at the selected column. In this operation, provision may be made such that one of the constant current sources 14 on the selected row is set active while the remaining constant current sources 14 are set inactive. Alternatively, only one constant current source 14 may be provided, and may be used regardless of which row is selected.

It should be noted that the above description has been directed to a case in which a single bit corresponds to a single column. Alternatively, provision may be made such that a plurality of bits corresponds to a single column. In such a case, a plurality of bit lines may be coupled to respective latches 15, which may also be coupled to respective constant current sources 14. Each latch 15 thus senses data of a corresponding memory cell by use of a corresponding reference current.

Figure 10:
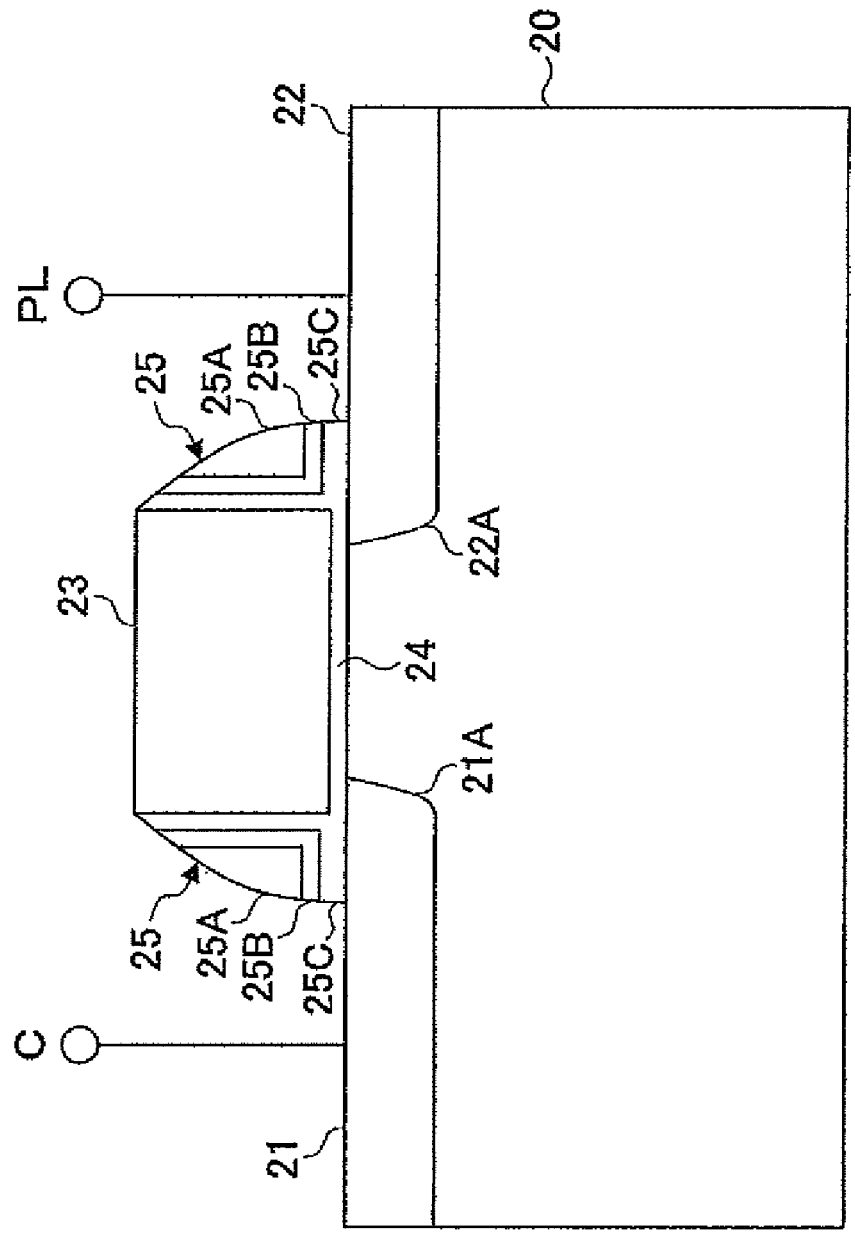
FIG. 10 is a cross-sectional view of a variation of the NMOS transistor shown in FIG. 1.

FIG. 10 is a cross-sectional view of a variation of the NMOS transistor 13 shown in FIG. 1. In FIG. 10, the same elements as those of FIG. 2 are referred to by the same numerals, and a description thereof will be omitted. In the case of the NMOS transistor 13 shown in FIG. 2, each of the sidewalls 25 may have a monolithic structure made of such a material as silicon dioxide, for example. In FIG. 10, each of the sidewalls 25 may have a multilayer structure comprised of at least three films of at least two different semiconductor materials. The multiplayer structure may include a silicon dioxide film 25A, a silicon nitride film 25B, and a silicon dioxide film 25C. Such a three-layer structure shown in FIG. 10 creates potential barriers having a dip in the middle with respect to electrons. Accordingly, the sidewalls 25 shown in FIG. 10 can easily trap a large amount of electrons in a short time. That is, the write operation as previously described can be reliably completed in a short time period. Further, these sidewalls 25 can keep the electrons trapped therein for a long time.

Further, the present invention is not limited to these embodiments, but various variations and modifications may be made without departing from the scope of the present invention.

What is claimed is:

1. A memory circuit, comprising:
   a latch having a first node and a second node to store data such that a logic level of the first node is an inverse of a logic level of the second node;
   a MIS transistor having a gate node, a first source/drain node, and a second source/drain node, the first source/drain node coupled to the first node of the latch; and
   a control circuit configured to control the gate node and second source/drain node of the MIS transistor to make a lingering change in a threshold voltage of the MIS transistor in a first operation and to cause the latch in a second operation to store data responsive to whether a lingering change in the threshold voltage is present,
   wherein the MIS transistor includes:
   diffusion regions formed in a substrate;
   a gate electrode; and
   sidewalls,
   wherein a metallurgical junction of each of the diffusion regions is positioned under the gate electrode, and a lateral boundary of a depletion layer in one of the diffusion regions serving as a drain is positioned under a corresponding one of the sidewalls in the first operation.

2. The memory circuit as claimed in claim 1, wherein each of the sidewalls has a multilayer structure.

3. The memory circuit as claimed in claim 2, wherein each of the sidewalls includes at least three films of at least two different semiconductor materials.

4. The memory circuit as claimed in claim 2, wherein each of the sidewalls includes:
   a first silicon dioxide film;
   a silicon nitride film; and
   a second silicon dioxide film.

5. The memory circuit as claimed in claim 1, wherein the control circuit is configured to cause the latch in the second operation to compare a drain current running through the MIS transistor with a reference current to store the data responsive to whether a lingering change in the threshold voltage is present.

6. The memory circuit as claimed in claim 1, wherein whether a lingering change is made in the threshold voltage of the MIS transistor in the first operation depends on whether the logic level of the first node of the latch is a logical high or a logical low during the first operation.

7. The memory circuit as claimed in claim 1, wherein the lingering change made in the threshold voltage of the MIS transistor in the first operation is made by a hot-carrier effect causing hot carriers to be trapped in said corresponding one of the sidewalls.

8. The memory circuit as claimed in claim 7, wherein the hot carriers are created by impact ionization occurring at the lateral boundary of the depletion layer in said one of the diffusion regions serving as the drain.

* * * * *